United States Patent
Dahal et al.

(10) Patent No.: US 9,810,794 B2
(45) Date of Patent: Nov. 7, 2017

(54) FABRICATING RADIATION-DETECTING STRUCTURES

(71) Applicant: RENSSELAER POLYTECHNIC INSTITUTE, Troy, NY (US)

(72) Inventors: Rajendra P. Dahal, Troy, NY (US); Ishwara B. Bhat, Clifton Park, NY (US); Yaron Danon, Selkirk, NY (US); James Jian-Qiang Lu, Watervliet, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 15/319,965

(22) PCT Filed: Jun. 22, 2015

(86) PCT No.: PCT/US2015/036921
§ 371 (c)(1),
(2) Date: Dec. 19, 2016

(87) PCT Pub. No.: WO2016/053413
PCT Pub. Date: Apr. 7, 2016

(65) Prior Publication Data
US 2017/0139060 A1    May 18, 2017

Related U.S. Application Data

(60) Provisional application No. 62/015,573, filed on Jun. 23, 2014.

(51) Int. Cl.
*H01L 21/00*     (2006.01)
*G01T 1/24*      (2006.01)
(Continued)

(52) U.S. Cl.
CPC ............ *G01T 1/24* (2013.01); *G01T 3/08* (2013.01); *H01L 31/115* (2013.01); *H01L 31/18* (2013.01)

(58) Field of Classification Search
CPC ............................ H01L 31/115; G01T 3/08
(Continued)

(56) References Cited

U.S. PATENT DOCUMENTS 5,338,416 A    8/1994    Mlcak et al.
5,866,931 A    2/1999    Bulucea et al.
(Continued)

OTHER PUBLICATIONS

McGregor et al., "Self-Biased Boron-10 Coated High-Pruity Epitaxial GaAs Thermal Neutron Detectors", IEEE Transactions on Nuclear Science, vol. 47, No. 4, Aug. 2000 (pp. 1364-1370).
(Continued)

*Primary Examiner* — Brook Kebede
(74) *Attorney, Agent, or Firm* — Kevin P. Radigan, Esq.; Heslin Rothenberg Farley & Mesiti P.C.

(57) ABSTRACT

Methods for fabricating radiation-detecting structures are presented. The methods include, for instance: fabricating a radiation-detecting structure, the fabricating including: providing a semiconductor substrate, the semiconductor substrate having a plurality of cavities extending into the semiconductor substrate from a surface thereof; and electrophoretically depositing radiation-detecting particles of a radiation-detecting material into the plurality of cavities extending into the semiconductor substrate, where the electrophoretically depositing fills the plurality of cavities with the radiation-detecting particles. In one embodiment, the providing can include electrochemically etching the semiconductor substrate to form the plurality of cavities extending into the semiconductor substrate. In addition, the providing can further include patterning the surface of the semiconductor substrate with a plurality of surface defect
(Continued)

areas, and the electrochemically etching can include using the plurality of surface defect areas to facilitate electrochemically etching into the semiconductor substrate through the plurality of surface defect areas to form the plurality of cavities.

20 Claims, 9 Drawing Sheets

(51) Int. Cl.
*G01T 3/08* (2006.01)
*H01L 31/115* (2006.01)
*H01L 31/18* (2006.01)

(58) Field of Classification Search
USPC .......................................................... 438/56
See application file for complete search history.

(56) References Cited

U.S. PATENT DOCUMENTS

| | | | |
|---|---|---|---|
| 6,545,281 | B1 | 4/2003 | McGregor et al. |
| 6,645,787 | B2 | 11/2003 | Nemirovsky et al. |
| 7,164,138 | B2 | 1/2007 | McGregor et al. |
| 7,183,701 | B2 | 2/2007 | Downing et al. |
| 7,372,009 | B1 | 5/2008 | Losee et al. |
| 7,592,601 | B2 | 9/2009 | Frank |
| 7,855,372 | B2 | 12/2010 | McGregor et al. |
| 8,022,369 | B2 | 9/2011 | Orava et al. |
| 8,778,715 | B2 | 7/2014 | Bellinger et al. |
| 2009/0302231 | A1 | 12/2009 | McGregor et al. |
| 2010/0304204 | A1 | 12/2010 | Routkevitch et al. |
| 2012/0097224 | A1 | 4/2012 | Guo et al. |
| 2012/0235260 | A1 | 9/2012 | Nikolic et al. |
| 2012/0313196 | A1 | 12/2012 | Li |
| 2013/0334541 | A1 | 12/2013 | Voss et al. |
| 2013/0344636 | A1* | 12/2013 | Bellinger ................ H01L 31/18 438/56 |
| 2014/0061490 | A1 | 3/2014 | Zhao et al. |
| 2014/0077089 | A1 | 3/2014 | Orava et al. |
| 2014/0252520 | A1* | 9/2014 | Dahal ...................... G01T 3/00 257/429 |

OTHER PUBLICATIONS

Dahal et al., International Search Report & Written Opinion for PCT/US2015036921 (WO 2016/053413 A1), dated Mar. 11, 2016 (12 pages).

* cited by examiner

FABRICATING RADIATION-DETECTING STRUCTURES

CROSS-REFERENCE TO RELATED APPLICATION

This application is a §371 U.S. National Phase application which claims priority from International Application Serial No. PCT/US2015/036921, filed Jun. 22, 2015, which published Apr. 7, 2016 as PCT Publication No. WO 2016/053413 A1, and which claims the benefit of U.S. Provisional Patent Application No. 62/015,573, filed Jun. 23, 2014, each of which is hereby incorporated herein by reference in its entirety.

STATEMENT REGARDING FEDERALLY SPONSORED RESEARCH OR DEVELOPMENT

This invention was made with United States Government support under contract number ECCS1348269, awarded by the National Science Foundation (NSF). The United States Government has certain rights in the invention.

BACKGROUND

Solid state radiation detectors, such as neutron detectors and gamma ray detectors, have been proposed as alternatives to gas-tube based detectors. For example, a solid state radiation detector can include a radiation-detecting hetero-structure having a radiation-detecting material embedded within a semiconductor substrate. When radiation impinges upon such a radiation detector, the radiation-detecting material can respond to the radiation by releasing charged reaction products. In such a case, the semiconductor substrate can be used to collect the charged reaction products and indicate a radiation detection event.

For instance, radiation-detecting hetero-structures may be formed by using physical etching processes, such as reactive ion etching (RIE) to form trenches in a semiconductor substrate, followed by using chemical vapor deposition (CVD) to deposit radiation-detecting material within the formed trenches. However, RIE and CVD processes are quite complicated, requiring expensive specialized equipment, and can lead to poor fill ratios of radiation-detecting material. Therefore a need exists for enhanced methods for fabricating radiation-detecting structures at reduced cost and complexity, to overcome the limitations of existing methods.

BRIEF SUMMARY

The shortcomings of the prior art are overcome, and additional advantages are provided, through the provision, in one aspect, of a method for fabricating a radiation-detecting structure. The method includes: providing a semiconductor substrate comprising a plurality of cavities extending into the semiconductor substrate from a surface thereof; and electrophoretically depositing radiation-detecting particles of a radiation-detecting material into the plurality of cavities extending into the semiconductor substrate, where the electrophoretically depositing fills the plurality of cavities with the radiation-detecting particles. For example, the method can allow the radiation-detecting particles to reach deeply into and completely fill cavities, including closely spaced cavities with large aspect ratios.

In one embodiment, the providing includes electrochemically etching the semiconductor substrate to form the plurality of cavities extending into the semiconductor substrate. For example, the electrochemically etching allows the plurality of cavities to be formed with uniform dimensions, e.g., without bottlenecks, facilitating deposition of radiation-detecting particles therein.

In another embodiment, the method includes connecting the semiconductor substrate to an electrode of an electrolytic apparatus, and using the electrolytic apparatus for both the electrochemically etching and the electrophoretically depositing. For example, using a combined electrolytic apparatus can improve process efficiency.

In a further embodiment, the providing further includes patterning the surface of the semiconductor substrate with a plurality of surface defect areas, and the electrochemically etching includes using the plurality of surface defect areas to facilitate electrochemically etching into the semiconductor substrate through the plurality of surface defect areas to form the plurality of cavities extending into the semiconductor substrate. For example, the patterning allows for the after-formed cavities to have any desired configuration, including dimensions and spacing.

In one embodiment, the surface of the semiconductor substrate comprises a (111) surface, and the electrochemically etching facilitates forming the plurality of cavities through the (111) surface of the semiconductor substrate. For example, the electrochemically etching can be used to form uniform cavities regardless of the orientation of the semiconductor substrate, because the etching rate is determined by the electrochemistry rather than the crystal orientation.

In another embodiment, the electrophoretically depositing includes overfilling the plurality of cavities of the semiconductor substrate with the radiation-detecting particles, and moving overfilled radiation-detecting particles above the plurality of cavities down into the plurality of cavities extending into the semiconductor substrate to further increase an amount of the radiation-detecting particles disposed therein. For example, increasing the amount of radiation-detecting materials can be used to increase the sensitivity of a radiation-detecting structure because a greater amount of material can interact with incoming radiation.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
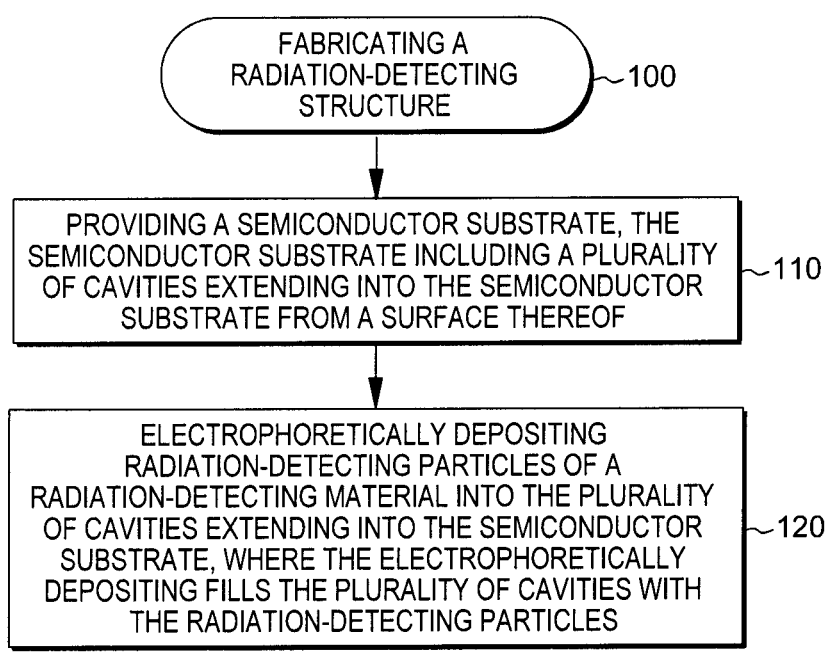
FIG. 1 depicts embodiments of a process for fabricating a radiation-detecting structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, methods for fabricating solid-state radiation-detecting structures for use, for example, in radiation detectors for detecting neutrons or gamma radiation. Such radiation detectors could be used, for instance, to monitor illicit nuclear activities at ports, highways, business centers, etc., wherever deployment may be desirable to help promote national security. Widespread deployment of radiation detectors has been hampered by fabrication costs and excessive size of existing radiation detectors, such as gas tube radiation detectors. Enhanced solid-state radiation detectors can address at least some of these concerns and facilitate their widespread deployment.

By way of example, solid-state radiation detectors can make use of solid-state radiation-detecting structures, such as hetero-structures having semiconductor materials and radiation-detecting materials. One way to fabricate such structures is to form cavities, such as holes or trenches, in a semiconductor substrate and provide radiation-detecting material within the formed cavities. In particular, reactive ion etching (RIE) could be used to form cavities within semiconductor substrates and chemical vapor deposition (CVD) might be used to provide the radiation-detecting material within the formed cavities. Unfortunately, both RIE and CVD processes are expensive and time consuming, require specialized equipment, and are not readily scalable.

Advantageously, the methods disclosed herein provide lower-cost, scalable approaches to forming radiation-detecting structures, which allow for high throughput formation of the radiation-detecting structures. In addition, methods disclosed herein result in enhanced radiation detectors that contain a greater proportion of radiation-detecting material within the cavities. Further, the methods disclosed can simplify fabrication processing and improve yields by allowing room-temperature fabrication of the radiation-detecting structures, and avoid the use of toxic process gases.

Reference is made below to the drawings, which are not drawn to scale for ease of understanding, wherein the same reference numbers used throughout different figures designate the same or similar components.

FIG. 1 depicts an embodiment of a process for fabricating a radiation-detecting structure, in accordance with one or more aspects of the present invention.

The fabricating of a radiation-detecting structure 100 includes, for instance: providing a semiconductor substrate, the semiconductor substrate having a plurality of cavities extending into the semiconductor substrate from a surface thereof 110; and electrophoretically depositing radiation-detecting particles of a radiation-detecting material into the plurality of cavities extending into the semiconductor substrate, where the electrophoretically depositing fills the plurality of cavities with the radiation-detecting particles 120.

In one example, the providing 110 includes electrochemically (or chemically) etching the semiconductor substrate to form the plurality of cavities extending into the semiconductor substrate. In such a case, the providing may further include patterning the surface of the semiconductor substrate with a plurality of surface defect areas, and the electrochemically etching may include using the plurality of surface defect areas to facilitate electrochemically etching into the semiconductor substrate through the plurality of surface defect areas to form the plurality of cavities extending into the semiconductor substrate. In another example, the method can further include connecting the semiconductor substrate to an electrode of an electrolytic apparatus, and using the electrolytic apparatus for both the etching and the electrophoretically depositing.

In one implementation, the electrochemically (or chemically) etching can include forming the plurality of cavities with a width that is approximately constant for a length of the plurality of cavities from an upper surface of the semiconductor substrate, where the approximately constant width of the plurality of cavities facilitates electrophoretically depositing the radiation-detecting material into the plurality of cavities. In another implementation, the electrochemically etching includes using the semiconductor substrate as an electrode during the electrochemically etching. In a further implementation, the surface of the semiconductor substrate is or includes a (111) surface, and the etching facilitates forming the plurality of cavities through the (111) surface of the semiconductor substrate.

In one embodiment, the electrophoretically depositing 120 includes: dispersing the radiation-detecting particles within a liquid to which the plurality of cavities of the semiconductor substrate are exposed; and applying an electromagnetic field, the electromagnetic field being substantially oriented along a direction in which the plurality of cavities extend into the semiconductor substrate, where the electromagnetic field facilitates depositing the radiation-detecting particles within the plurality of cavities of the semiconductor substrate. In another embodiment, the strength of the electromagnetic field is selected to achieve a target packing ratio of the radiation-detecting particles within the plurality of cavities of the semiconductor substrate.

In one embodiment, the electrophoretically depositing 120 includes: overfilling the plurality of cavities of the semiconductor substrate with the radiation-detecting particles; and then moving or forcing overfilled radiation-detecting particles into the plurality of cavities extending into the semiconductor substrate to increase an amount of the radiation-detecting particles disposed therein. In such a case, the moving may include mechanically forcing the overfilled radiation-detecting particles into the plurality of cavities of the semiconductor substrate. In another embodiment, the disposing can include annealing the radiation-detecting structure to compact the overfilled radiation-detecting particles down into the plurality of cavities of the semiconductor substrate.

In one example, the electrophoretically depositing 120 may include disposing different sized radiation-detecting particles of the radiation-detecting material, for instance, in a range of 1 nm to 3 μm into the plurality of cavities of the semiconductor substrate, where the combination of the different sized radiation-detecting particles facilitates dense filling of the plurality of the cavities with the radiation-detecting material.

In another example, the providing 110 may include providing the plurality of cavities of the semiconductor substrate with a characteristic opening in a range of 3 μm to 5 μm, and the electrophoretically depositing facilitates driving radiation-detecting particles in a range of, for instance, 1 nm to 3 μm down into the plurality of cavities. In a further example, the electrophoretically depositing 120 may include using the semiconductor substrate as an electrode during the electrophoretically depositing.

In one or more implementations, the method may include forming, before the electrophoretically depositing, a continuous p-n junction within the semiconductor substrate and disposed, in part, parallel to the surface of the semiconductor substrate from which the plurality of cavities extend into the semiconductor substrate and in spaced opposing relation to inner cavity walls of the semiconductor substrate defining the plurality of cavities therein, where the continuous p-n junction is spaced from the surface of the semiconductor substrate a greater distance than the continuous p-n junction is spaced in opposing relation to the inner cavity walls of the semiconductor substrate.

In certain implementations, the radiation-detecting material is chosen to respond to radiation by releasing charged reaction products, and the radiation-detecting structure senses the charged reaction products to detect the radiation.

In one or more embodiments, the radiation-detecting structure may be a neutron-detecting structure, and the radiation-detecting material may comprise boron. In another embodiment, the radiation-detecting structure may be a gamma radiation detecting structure, and the radiation-detecting material comprises one of CdTe, or CdZnTe. In a further process embodiment, the providing may provide a plurality of cavities with bottlenecks at openings thereof, and the electrophoretically depositing may include using an electromagnetic field to drive the radiation-detecting particles through the bottlenecks at the openings of the cavities to fill the plurality of cavities with the radiation-detecting particles.

FIGS. 2A-2L illustrate, by way of example, various aspects of the above-summarized methods of fabrication.

Figure 2A:
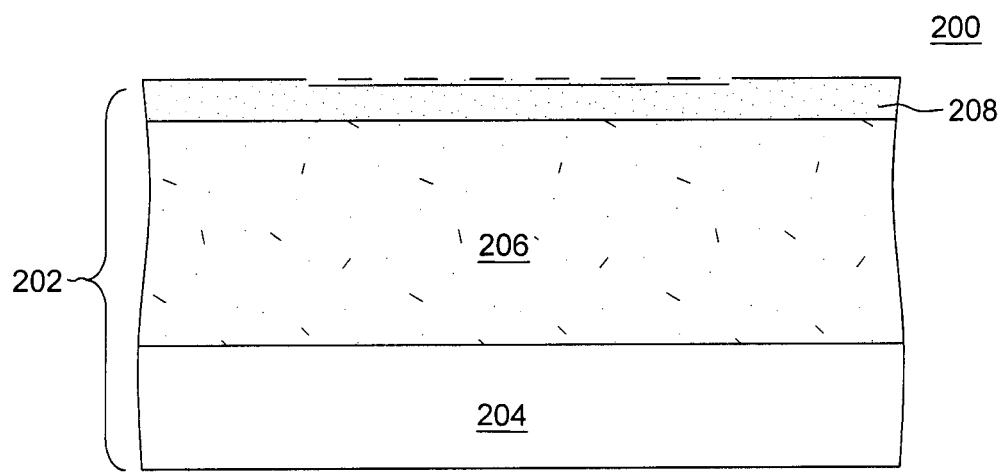
FIG. 2A is a cross-sectional elevational view of a structure found in a radiation-detecting structure fabrication process, in accordance with one or more aspects of the present invention.

Referring to FIG. 2A, a cross-sectional elevational view of a structure 200 is shown obtained during a radiation-detecting structure fabrication process, in accordance with one or more aspects of the present invention. In the embodiment of FIG. 2A, structure 200 includes a substrate 202. By way of example, substrate 202 may be a crystalline semiconductor material, such as silicon (Si), germanium (Ge), gallium arsenide (GaAs), gallium nitride (GaN), aluminum nitride (AlN), silicon carbide (SiC), or any combination thereof. In addition, substrate 202 may have a specific crystallographic orientation, such that an upper surface of substrate 202 is one of a (100) surface, a (110) surface, or a (111) surface. Further, substrate 202 may include multiple regions with different doping types, such as n-type or p-type dopants of varying concentrations.

In the illustrated embodiment, substrate 202 has been implanted with n-type dopants to create a high-conducting $n^+$ region 204, as well as an $n^-$ region 206. A semiconductor region with an n-type dopant refers to the addition of impurities to, for instance, intrinsic (un-doped) semiconductor substrate material, which contribute more electrons to the intrinsic material, and may include (for instance) phosphorus, arsenic or antimony. In one example, $n^+$ region 204 and $n^-$ region 206 of the substrate may be formed using conventional ion implantation or diffusion processing techniques. The $n^+$ region 204 may have a thickness in the range of about 100 to 1,000 microns, and $n^-$ region may have a thickness of about 40 μm to 50 μm. Additionally, the resistivity of $n^-$ region may be in the range of about 10-50 Ω-cm. In one particular example, $n^+$ region 204 of substrate 202 may be heavily-doped with n-type dopants compared with $n^-$ region 206 of substrate 202.

Substrate 202 of structure 200 is shown to also include a highly conducting $p^+$ region 208 disposed over $n^-$ region 206. For example, $p^+$ region 208 may be obtained by addition of impurities to, for instance, intrinsic (un-doped) substrate material to create deficiencies of valence electrons in the intrinsic material. Examples of appropriate p-type dopant include boron, aluminum, gallium, or indium. In one example, $p^+$ region 208 of substrate 202 may be formed using conventional ion implantation or diffusion processing techniques and may have thickness of about 1 to 3 μm. In another example, the substrate may be a lightly doped p-type substrate, and a heavily-doped n+ contact layer may be disposed above the substrate.

Figure 2B:
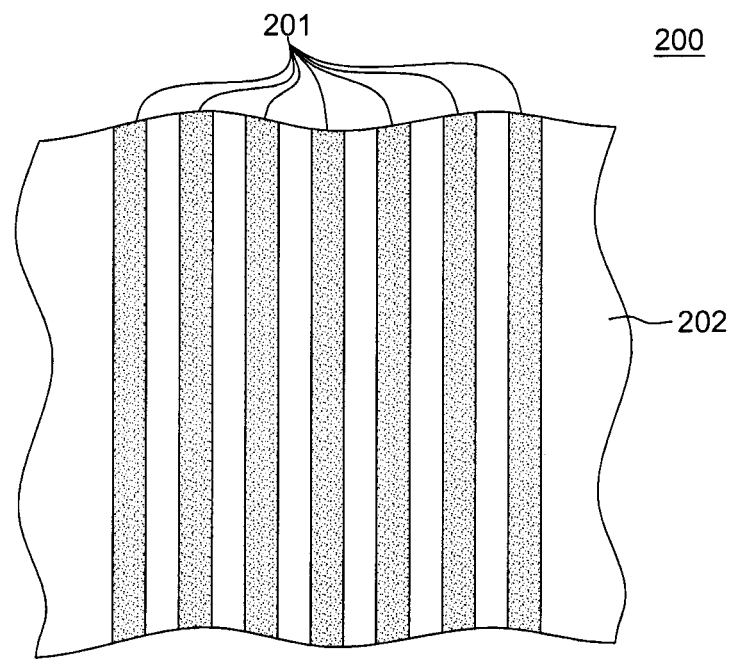
FIG. 2B is a plan view of the structure of FIG. 2A, after patterning a surface of a semiconductor substrate thereof with a plurality of surface defect areas, in accordance with one or more aspects of the present invention.
Figure 2C:
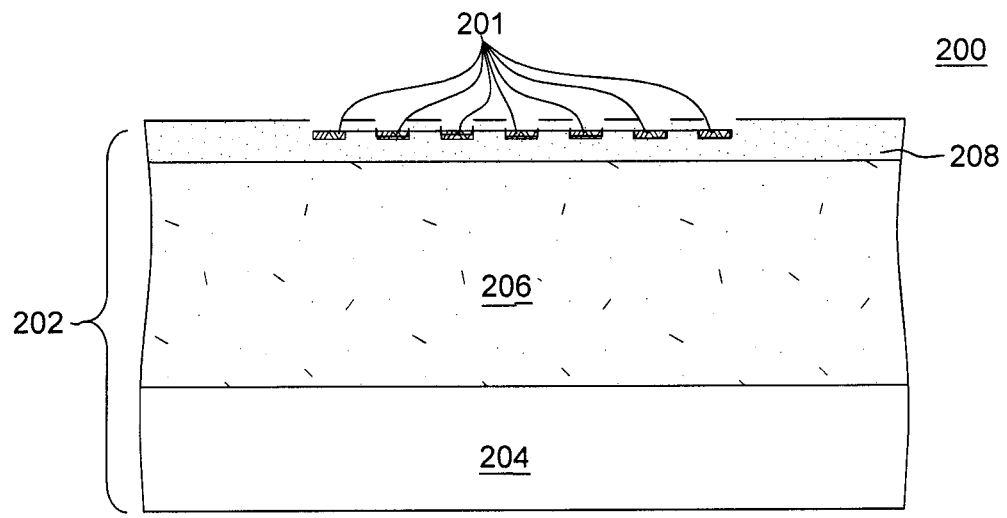
FIG. 2C is a cross-sectional elevational view of one embodiment of the structure of FIG. 2B, in accordance with one or more aspects of the present invention.

FIGS. 2B-2C depicts structure 200, after patterning the upper surface of substrate 202 with a plurality of surface defect areas 201, in accordance with one or more aspects of the present invention. As depicted in the plan view of FIG. 2B, surface defect areas 201 may be configured as parallel, evenly spaced lines or areas, which can subsequently be used, as described below, in the formation of a plurality of parallel, evenly spaced cavities or trenches. In other examples, different surface defect areas may be patterned to achieve different configurations. Reference in this regard, the structure of FIG. 4.

In one or more embodiments, surface defect areas 201 may be regions in which the regular crystal lattice of substrate 202 has been disturbed to facilitate an electrochemical etching process such as described below. These defects are areas through which etching can be advantageously directed. In particular, by patterning substrate 202 with a desired defect area pattern, subsequent electrochemical etching can be directed through the pattern to form trenches with desired spacing and dimensions.

In one embodiment, substrate 202 may be patterned with surface defect areas 201 using electron beam lithography to form the surface defects. In another example, substrate 202 may be patterned using photolithographic masking and chemical etching techniques to form the surface defects.

In the cross-sectional elevational view of FIG. 2C, surface defect areas 201 are depicted as extending a short distance into substrate structure 202. For example, surface defect areas may be microscopic disturbances of the single crystal structure of substrate 202 at its surface which are not visible without magnification. Surface defect areas may only extend a few atomic layers into substrate structure 202, depending on the patterning process employed. In one or more embodiments, surface defect areas 201 may be lithographically defined and wet-etched to form groove type defects on the surface of substrate structure 202.

Figure 2D:
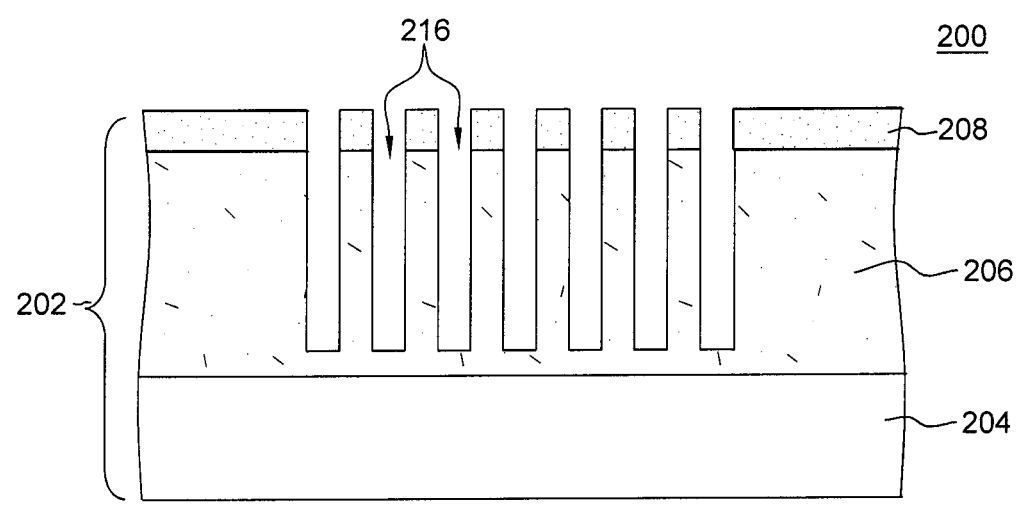
FIG. 2D depicts the structure of FIG. 2C after electrochemically etching the semiconductor substrate thereof to form a plurality of cavities extending into the semiconductor substrate, in accordance with one or more aspects of the present invention.

FIG. 2D depicts structure 200 after electrochemically etching substrate 202 to form the cavities 216 extending into substrate 202, in accordance with one or more aspects of the present invention.

In one embodiment, after patterning the surface of substrate 202 with the defects of surface defect areas 201 (FIG. 2C), substrate 202 may be coupled to be a working electrode in an electrochemical etching process. In such a case, substrate 202 could be exposed to an electrolyte, such as hydrofluoric (HF) acid, for the timed electrochemical etching.

By way of explanation, in an electrochemical etching process, electromagnetic radiation may be directed from a back side of substrate 202 to create electron-holes, which drift to portions of substrate 202 extending vertically under surface defect areas 201, due to the increased electromagnetic field resulting from interaction of the electromagnetic field with the crystal defects in surface defect areas 201. In addition, regions of substrate 202 extending vertically under un-patterned portions will be depleted of charge carriers. In such a process, substrate etching will tend to be promoted in the regions of substrate 202 extending vertically under surface defect areas 201 due to the concentration of electron-holes in those regions, and inhibited in other regions of substrate 202 due to charge-carrier depletion, leading to the formation of cavities 216 by the electrochemical etching.

In one etch embodiment, a platinum wire may serve as a counter-electrode in an electrochemical etching cell or chamber. In such a case, for example, the two electrodes (i.e., the wire and the substrate) may be biased in such a way that minority carriers (electron-holes) generated by the electromagnetic radiation will be diffused to regions below surface defect areas 201, where the electromagnetic field is higher, leading to portions of substrate 202 located below surface defect areas 201 being etched away, as discussed.

In another embodiment, the etching may proceed into substrate 202 in a direction normal to the upper surface thereof, and the etching is prevented between surface defect areas 201 due to formation of a depletion layer within the substrate by the electromagnetic field. In such a manner, the electrochemical etching process uses the surface defect areas 201 to facilitate the electrochemically etching of substrate 202 to form the cavities 216.

As noted, in one or more embodiments, HF may be used as the electrolyte, and substrate 202 may include Si or SiC. In such a case, the Si or SiC of substrate 202 will be oxidized and dissolved in the HF electrolyte, with the etching proceeding until cavities 216 reach the desired depth into substrate 202. Indeed, the etching can reach all the way through substrate 202, if desired. In one specific example, cavities 216 may have a width of approximately 3 μm to 5 μm and a depth of approximately 40 μm to 50 μm.

In another embodiment, the depth can be extended to 200 μm or more, and the effective density of after-formed radiation-detecting material, such as boron nano-particles deposited within cavities 216, may be a relatively low density. In such a case, the lower density may allow for a greater absorption path for detecting thermal neutrons.

Advantageously, using an electrochemical etching process as described herein may be achieved at low cost and with low system complexity as compared with, for instance, reactive ion etching (RIE) processes, because no expensive tools are required and no toxic gases are released. In addition, the above-described electrochemical etching process may be readily scaled up. For example, the process can include first simultaneously patterning many semiconductor substrates (e.g., wafers), followed by using a single electrochemical etching chamber or cell with a larger beaker size and liquid volume. Such a process can form cavities in all the substrates at the same time, further reducing fabrication costs.

As another advantage, electrochemical etching as described herein forms bottleneck free cavities, helping the subsequent material deposition processing in which radiation-detecting material is deposited within the cavities to form the radiation-detecting structure. For example, electrochemical etching can be used to form cavities 216 with a characteristic width that is approximately constant along a length thereof from the substrate surface into the substrate. This advantageously allows after-deposited radiation-detecting material to reach deeply into and fully fill cavities 216. By contrast, RIE processes tend to lead to formation of cavities with bottlenecks at their openings, potentially blocking the deposition of radiation-detecting material within such cavities, leading to voids without radiation detecting material. If radiation impinges upon a void in a radiation-detecting structure, there will not be a reaction, and the radiation will not be detected.

As a further advantage, electrochemical etching as described herein may be used with any orientation of substrate 202. For example, regardless of whether substrate 202 is oriented with a (100) upper surface, a (110) upper surface, or a (111) upper surface, the above-described electrochemical etching process described for the formation of cavities having an approximately continuous width or depth, because the process is not based on the different chemical etching rates for different crystal orientations of semiconductors.

Figure 2E:
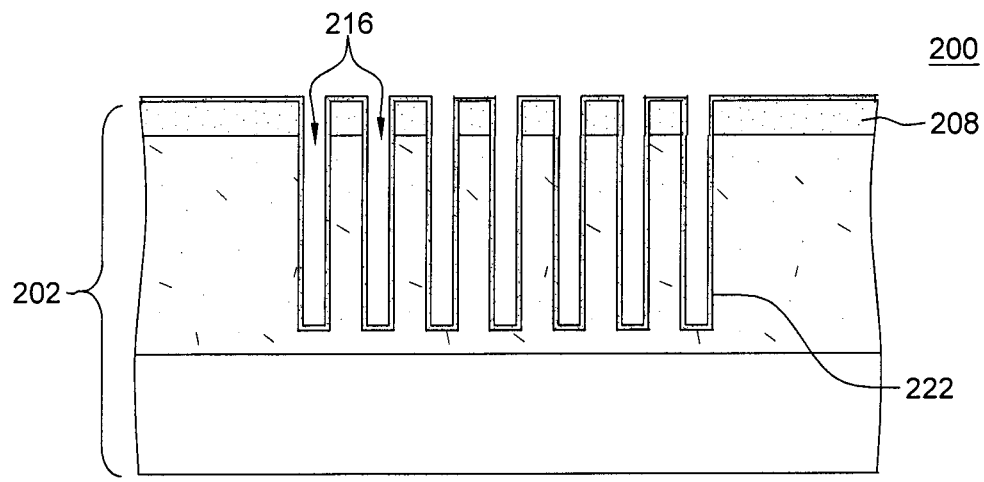
FIG. 2E depicts the structure of FIG. 2D, after provision of a conformal layer of material over the structure, including within the cavities thereof, in accordance with one or more aspects of the present invention.
Figure 2F:
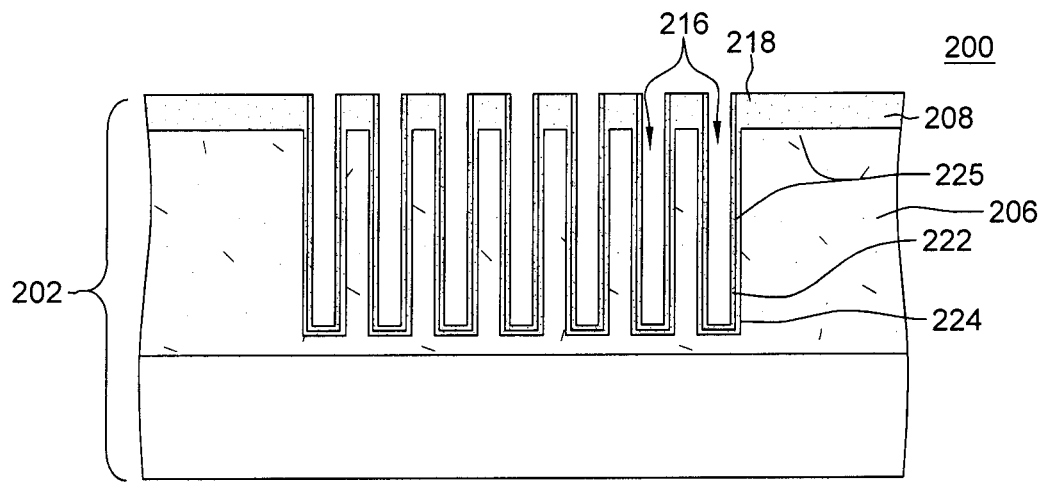
FIG. 2F depicts the structure of FIG. 2E, after a continuous p-n junction has been formed within the semiconductor substrate thereof, in accordance with one or more aspects of the present invention.
Figure 2G:
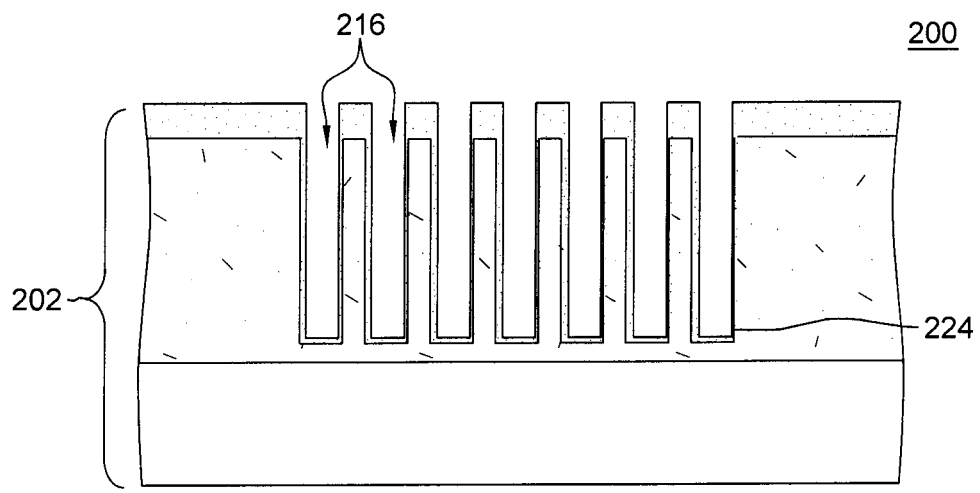
FIG. 2G depicts the structure of FIG. 2F, after optional removal of the conformal layer of material from the plurality of cavities thereof, in accordance with one or more aspects of the present invention.

By way of explanation, FIGS. 2E-2G illustrate details of fabrication processing steps for providing a continuous p-n junction within the semiconductor substrate. In one or more embodiments, formation of a continuous p-n junction may allow for a radiation-detecting structure to efficiently collect charges generated when radiation reacts with radiation-detecting material of the radiation detecting structure, in order to detect the radiation.

Referring to FIG. 2E, the structure of FIG. 2D is depicted, after provision of a conformal layer 222 over structure 200, including within cavities 216, in accordance with one or more aspects of the present invention. In one embodiment, conformal layer 222 may be deposited using a modified chemical vapor deposition (CVD) process. For example, the CVD process may be modified by varying parameters such as, temperature and pressure, to obtain the desired conformal layer thickness. In another embodiment, conformal layer 222 may include p-type dopant material, and may be deposited at a first temperature in the range of about 450° C. to 550° C.

In a further embodiment, conformal layer 222 may be or include neutron-responsive material, and/or may be or include a p-type dopant. Examples of appropriate p-type dopants include boron, aluminum, gallium, or indium. In one specific example, conformal layer 222 may include at least one of enriched boron ($^{10}$B) or a compound of enriched boron such as, for example, boron carbide ($^{10}$B$_4$C, $^{10}$B$_5$C) or boron nitride ($^{10}$BN).

In another specific example, conformal layer 222 may be deposited using a conventional CVD process, by employing enriched boron precursors such as, for example, diborane (B$_2$H$_6$), deca-borane (B$_{10}$H$_{14}$) or other metal organoborane precursors such as, triethylborane (C$_2$H$_5$)$_3$B or trimethylborane (CH$_3$)$_3$B, at about 500° C. Note that the enriched boron precursors employed may contain more than 95% of enriched boron ($^{10}$B) isotope. In one embodiment, thickness of the conformal layer along the inner walls of the cavities 216 may be, for example, in the range of about 10 to 20 nm.

FIG. 2F depicts the structure of FIG. 2E, after a continuous p-n junction has been formed within the substrate thereof, in accordance with one or more aspects of the present invention. In one embodiment, conformal layer 222 (of p-type dopant material) is subjected to a controlled annealing process to diffuse p-type dopants from conformal layer 222 into substrate 202 to provide a p-region 224 within substrate 202, including along inner walls of the cavities 216. In such a case, a continuous p-n junction 225 is formed within substrate 202 at interfaces between p$^+$ region 208 and n$^-$ region 206, and between p-region 224 and n$^-$ region 206.

In one embodiment, the controlled annealing to produce p-region 224 may be performed at a second temperature, higher than the first temperature used to deposit conformal layer 222. In such a case, a higher temperature anneal results in a portion of the p-type dopant from conformal layer 222 diffusing into the underlying n$^-$ region 206 of the substrate, thereby facilitating formation of the continuous p-n junction 225 within the substrate.

In one specific example, annealing temperature is at least about 100° C. to 300° C. higher than the conformal layer deposition temperature. As another specific example, continuous p-n junction 225 may be formed within substrate 202, by increasing the process temperature from 500° C. to about 700° C., for 10 to 30 minutes, to promote diffusion of p-type dopant (such as, for example, boron) from the conformal layer into the underlying n$^-$ region 206 of the substrate. In another embodiment, the thickness of p-region 224 may be controlled by controlling process parameters such as, for instance, temperature and time, at which the annealing is performed. For example, the thickness of p-region 224 may be in the range of about 20 nm to 200 nm.

In the embodiment of FIG. 2F, continuous p-n junction 225 is, in part, in spaced opposing relation to surface 218 of the substrate, and is, in part, in spaced opposing relation to the inner walls of substrate 202 defining cavities 216. As illustrated, continuous p-n junction 225 is spaced from surface 218 of the substrate 202 a greater distance than it is spaced from the inner cavity walls of the substrate. In one embodiment, conformal layer 222 may be polished back from upper surface of structure 200 using, for instance, by chemical mechanical polishing stopping on p$^+$ region 208 of the substrate. Note that the conformal layer of p-type dopant material disposed within cavities 216 would remain unaffected, during this etch-back polishing processing.

FIG. 2G depicts structure 200, after optional removal of conformal layer 222 from cavities 216 thereof, in accordance with one or more aspects of the present invention. In one embodiment, conformal layer 222 may be selectively removed using a plasma treatment process, for example using plasma formed from a mixture of oxygen (O$_2$) and a fluorine-containing gas, such as, carbon tetrafluoride (CF$_4$). In another embodiment, conformal layer 222 may remain within the plurality of cavities without affecting operation of the resultant radiation-detecting structure. For example, conformal layer 222 may be selected to include enriched boron ($^{10}$B) or compounds of enriched boron, so that removal of conformal layer 222 is not necessary in the fabrication of a neutron-detecting structure.

Figure 2H:
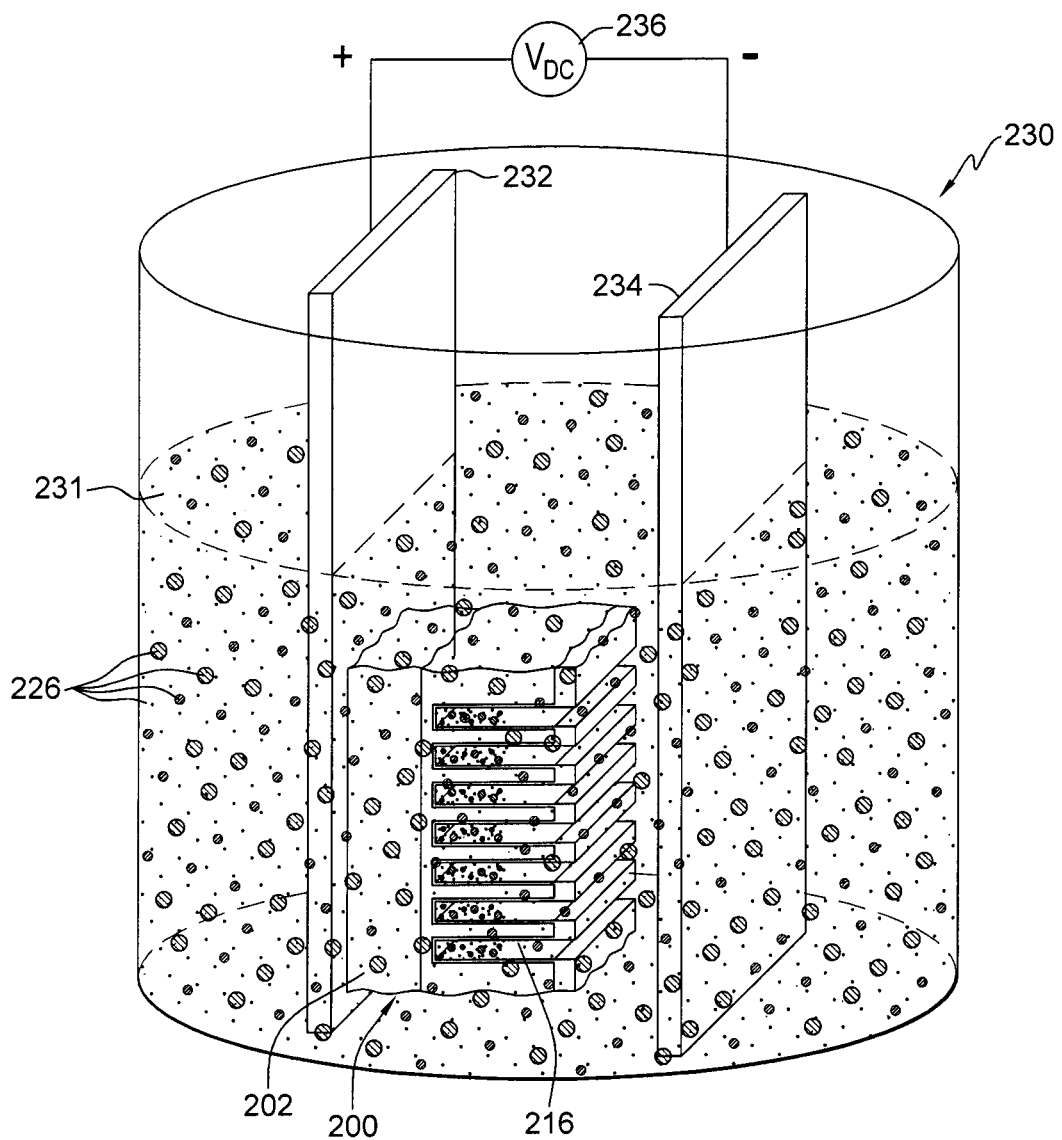
FIG. 2H depicts an electrophoretic deposition apparatus being used to electrophoretically deposit radiation-detecting particles into the plurality of cavities of the structure of FIG. 2G, in accordance with one or more aspects of the present invention.

FIG. 2H depicts an electrophoretic deposition apparatus 230, in accordance with one or more aspects of the present invention. Electrophoresis is the motion of dispersed particles within a liquid under the influence of an electromagnetic field, and as described herein, an electrophoresis process may be used to deposit radiation-detecting particles into cavities of a semiconductor substrate as part of forming the radiation-detecting structure.

By way of example, in the embodiment of FIG. 2H, an electrophoretic deposition apparatus 230 is shown, which includes a first electrode 232, a second electrode 234, and a DC power source 236. Within this apparatus, radiation-detecting particles 226 may be dispersed within a liquid 231, such as, for example, acetone, water, or isopropyl alcohol. In one or more embodiments, upon application of an appropriate DC voltage, an electromagnetic field is generated in the depicted apparatus in a horizontal direction between first electrode 232 and second electrode 234. As illustrated, structure 200 may be, in one or more embodiments, connected to first electrode 232 with the cavities 216 therein aligned along the horizontal direction. The applied electromagnetic field exerts force on radiation-detecting particles 226, with the force being directed horizontally towards the cavities 216, thereby facilitating transport of the radiation-detecting particles into the cavities 216.

Advantageously, the above-noted process may be performed at room temperature, and the electromagnetic field strength may be regulated so that the radiation-detecting particles 226 gradually fill cavities 216, allowing for achievement of a desired target packing ratio of radiation-detecting particles, without excessive stress being generated by the particles that could cause one or more sidewalls of cavities 216 to lose structural integrity and collapse. This is due, at least in part, to the low-temperature, gradual nature of the filling process.

In one or more embodiments, differently-sized radiation-detecting particles 226, for instance, within a range of 1 nm to 3 µm, may be dispersed within liquid 231. The provision of differently-sized radiation-detecting particles 226 advantageously facilitates filling cavities 216 within the substrate, since the differently-sized particles may more closely or densely accumulate within the cavities during deposition. For example, smaller radiation-detecting particles may pack within the interstices of larger radiation-detecting particles to achieve a higher fill ratio than might be achieved using only the larger radiation-detection particles. In another example, radiation-detecting particles may be approximately spherical in shape, potentially leading to a greater fill ratio. In another embodiment, radiation-detecting particles may have irregular shapes, or a mixture of irregular shapes and spherical shapes. In a further example, the electrodes of electrophoretic deposition apparatus 230 may be rotated counterclockwise 90°, compared to these in the embodiment of FIG. 2H, so that in addition to the electromagnetic field, gravitational forces may be used to act on radiation-detecting particles 226 during the filling of cavities 216.

In another implementation, electrophoretic deposition apparatus 230 can be a combined electrolytic apparatus, with the above-described electrochemical etching also being accomplished using the combined electrolytic apparatus. For instance, the apparatus could be initially employed with an electrochemical etching fluid, such as HF, followed by the electrophoretic deposition, using a radiation-detecting particle containing fluid. In one specific example, a 0.05 molar solution of boron carbide radiation-detecting nanoparticles could be dispersed in isopropyl alcohol, the electrodes could be spaced by approximately 1 centimeter, and a 50-200V bias could be applied to the electrodes electrophoretically deposit the radiation-detecting nanoparticles into cavities 216.

Figure 2I:
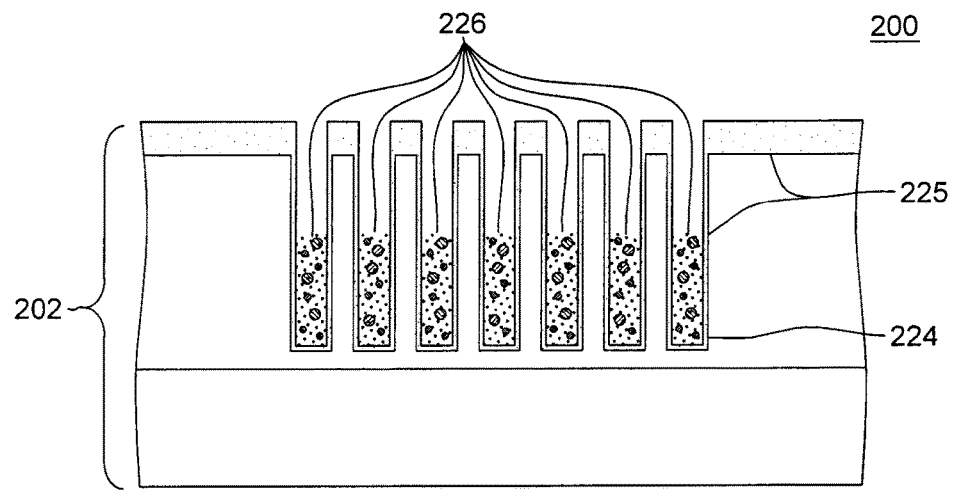
FIG. 2I depicts the structure of FIG. 2G, after partially electrophoretically depositing radiation-detecting particles into the plurality of cavities extending into the semiconductor substrate thereof, in accordance with one or more aspects of the present invention.

FIG. 2I depicts structure 200 of FIG. 2H after partially electrophoretically depositing radiation-detecting particles 226 within cavities 216 extending into substrate 202, in accordance with one or more aspects of the present invention. In the illustrated figure, cavities 216 have been filled (by way of example) approximately half-way with radiation detecting particles 226.

Depending on the configuration desired, the electrophoretic deposition process can proceed for a time duration sufficient to completely fill cavities 216. In one example, after 10 minutes, cavities 216 with a width of approximately 3 µm to 5 µm and a depth of approximately 40 µm to 200 µm, may be filled with a combination of nano-sized particles and micro-sized particles, such as in a range of 1 nm to 3 µm.

Figure 2J:
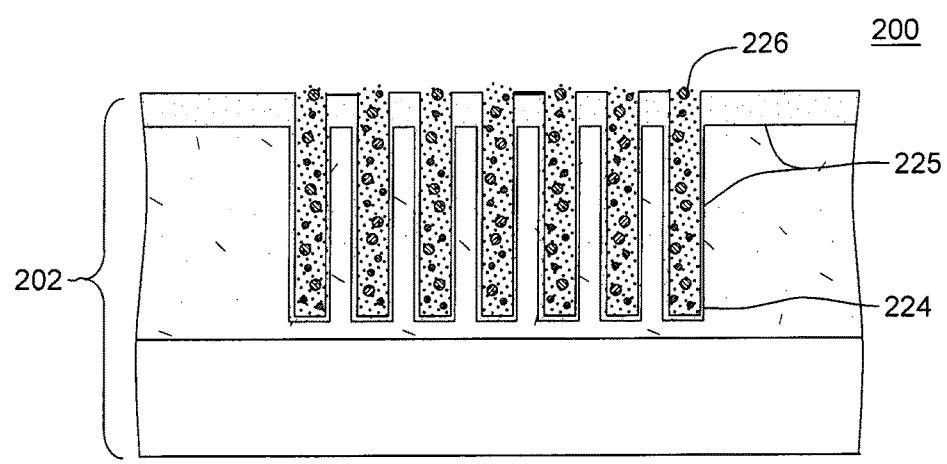
FIG. 2J depicts the structure of FIG. 2G, after an overfilling of the plurality of cavities of the semiconductor substrate thereof with radiation-detecting particles, in accordance with one or more aspects of the present invention.

FIG. 2J depicts structure 200 after an overfilling of cavities 216 with radiation-detecting particles 226, in accordance with one or more aspects of the present invention.

In particular, as noted, the electrophoretic deposition process described above may be used to selectively draw particles towards cavities 216, and not towards other portions of substrate 202, such as between cavities 216. Therefore, radiation-detecting particles 226 may be overfilled above the level of the surface of substrate 202, forming (for instance) a mound of radiation-detecting particles above cavities 216. Advantageously, these overfilled radiation-detecting particles may subsequently be moved or forced down into cavities 216 to further increase the amount of radiation-detecting material within the cavities.

Figure 2K:
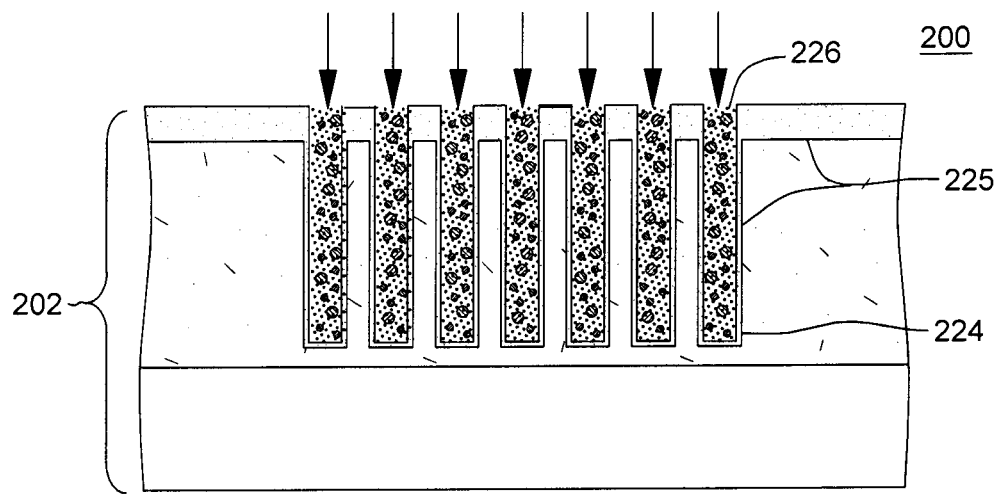
FIG. 2K depicts the structure of FIG. 2J, after moving any overfilling radiation-detecting particles into the plurality of cavities extending into the semiconductor substrate, in accordance with one or more aspects of the present invention.
Figure 2L:
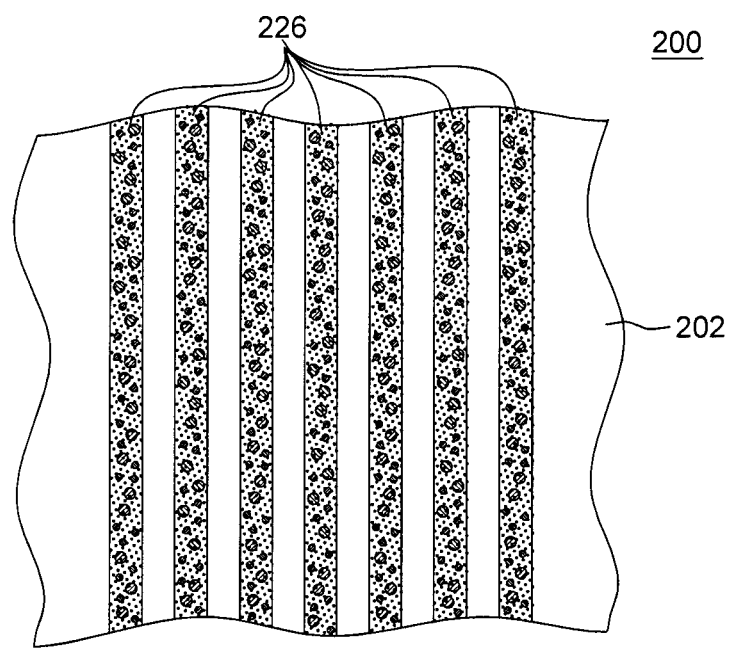
FIG. 2L is a plan view of the structure of FIG. 2K, in accordance with one or more aspects of the present invention.

FIGS. 2K-2L depict structure 200 after moving any overfilled radiation-detecting particles down into the cavities. As illustrated in FIG. 2K, in one embodiment, the overfilled radiation-detecting particles may be mechanically forced into cavities 216 of substrate 202. In another embodiment, structure 200, including overfilled radiation-detecting particles 226, may be annealed to compact the overfilled radiation-detecting particles into cavities 216. In one specific example, the overfilled radiation-detecting particles may extend several micrometers above the surface of substrate 202. In such a case, very flat plates may be mechanically applied with a specific force against substrate 202 to compact radiation-detecting particles into cavities 216.

As illustrated in the plan view of FIG. 2L, structure 200 may include radiation-detecting material 226 disposed within parallel trench cavities within substrate 202. Advantageously, this resultant structure comprises a plurality of evenly spaced trenches filled with radiation-detecting material. In subsequent operation, if radiation impacts the detector, it reacts with the radiation-detecting material to produce byproducts that will lead to charge carrier creation within substrate 202. Appropriate contact to, and biasing of, structure 200, may be used to collect the charge carriers, and thereby identify the radiation detection event.

Figure 3A:
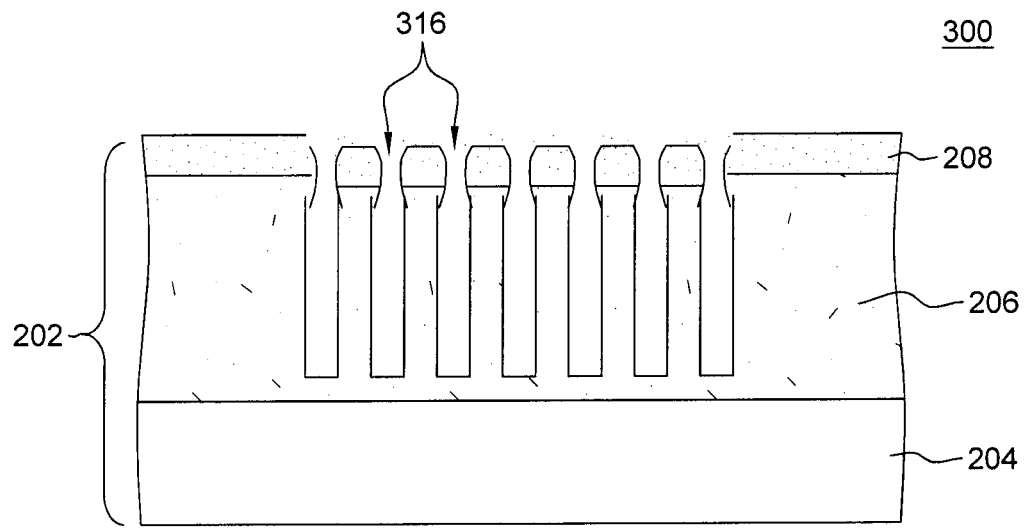
FIG. 3A depicts one embodiment of a structure obtained using an alternate radiation-detecting structure fabrication process, and which is to be filled, in accordance with one or more aspects of the present invention.
Figure 3B:
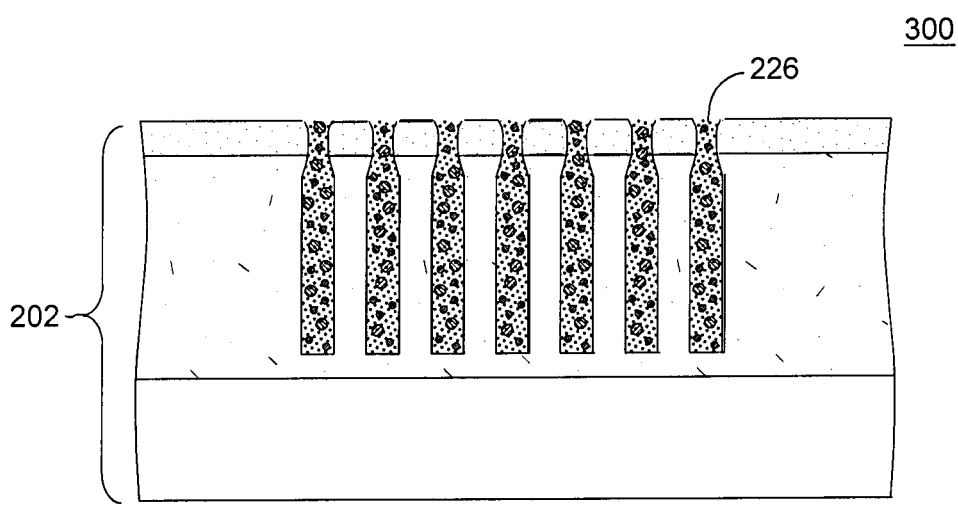
FIG. 3B depicts the structure of FIG. 3A, after filling the plurality of cavities of the semiconductor substrate with radiation-detecting particles, in accordance with one or more aspects of the present invention.

FIGS. 3A-3B illustrate embodiments of another process for fabricating a radiation-detecting structure, in which bottlenecked cavities may be completely filled with radiation-detecting material to form the radiation-detecting structures.

In particular, FIG. 3A, depicts one embodiment of a structure 300 obtained using an alternate radiation-detector fabrication process, which is to be filled, in accordance with one or more aspects of the present invention. In the embodiment of FIG. 3A, a plurality of cavities 316 have been provided in substrate structure 202. For example, substrate structure 202 may be patterned and etched using a reactive ion etching (RIE) process, to form cavities 316. In one specific example, deep reactive ion etching (DRIE) may be performed using fluorine-based chemistry to form cavities 316. In the example illustrated, the cavity formation process has result in cavities 316 having bottlenecks near the upper substrate surface. Bottlenecks are typically undesirable because they can become blocked in the early stages of a radiation-detecting material filling process, potentially leading to formation of voids within structure 200, e.g., below the bottlenecks. The presence of any void disadvantageously decreases the radiation-detecting efficiency of the resultant structure. However, FIG. 3B depicts structure 300 after filling cavities 316 with radiation-detecting particles 226, in accordance with the electrophoretic deposition (EPD) processes described herein. Advantageously, the EPD process will force the radiation-detecting particles past the bottlenecks, completely filling the cavities 316.

In one or more embodiments, electrophoretic deposition makes use of an electromagnetic field to move the radiation-detecting particles suspended in the liquid, and this process may be carried out at a low temperature, such as room temperature. In such a case, radiation-detecting particles will not collect and block the cavities at the bottlenecks, but instead will be pushed or forced along by the electromagnetic field deeper into cavities 316, past the bottleneck. Since the electromagnetic field continues to exert force on the radiation-detecting particles deep into substrate 202, past the bottlenecks of the cavities, the radiation-detecting particles will reach the bottom of cavities 316, and thus completely fill cavities 316. By contrast, in a physical or chemical deposition process, particles are directed toward the cavities with an initial force only, and are not continuously acted upon, as in an electrophoretic deposition process.

Figure 4:
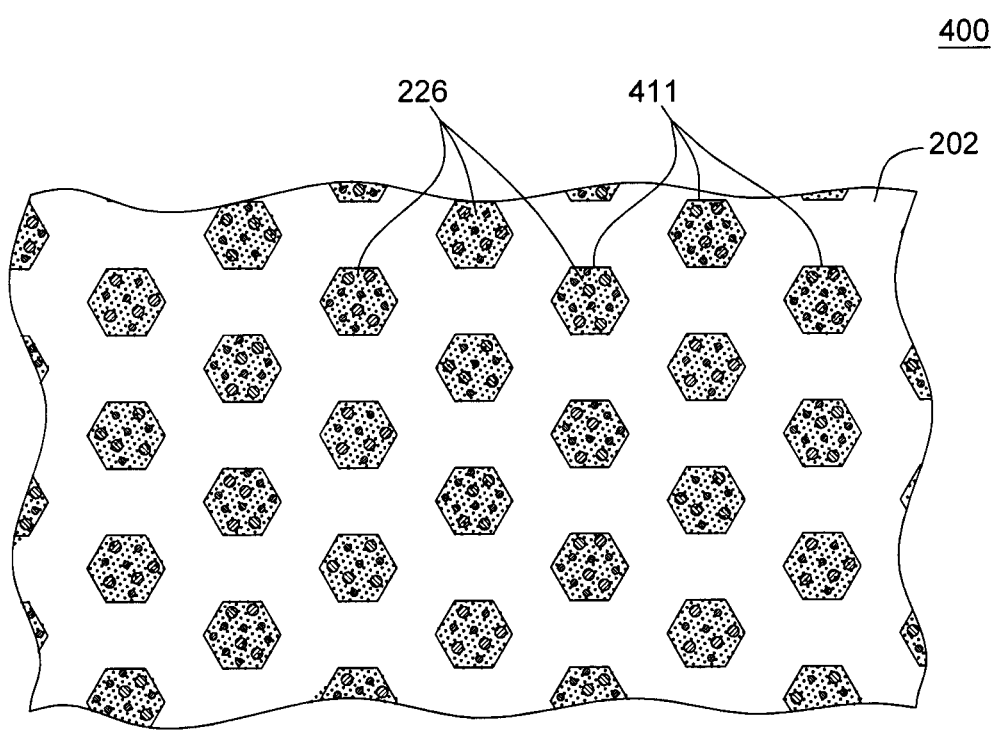
FIG. 4 depicts a radiation-detecting structure, in accordance with one or more aspects of the present invention.

FIG. 4 depicts a further variation of a radiation-detecting structure 400, in accordance with one or more aspects of the present invention. In the illustrated embodiment, structure 400 includes a plurality of hexagonal-shaped cavities which extend into substrate structure 202, and are arrayed in a honeycomb pattern, and which are filled with radiation-detecting particles 226. Advantageously, such a honeycomb pattern can provide radiation-detecting structure 400 with enhanced mechanical rigidity, and may be an advantageous configuration for certain radiation-detecting materials.

Those skilled in the art will note from the above description that there is a need for inexpensive and scalable processes for fabricating solid-state radiation-detecting structures, and particularly for manufacturing large area detector modules at competitive costs. Two principle areas of existing solid-state detector fabrication processes where costs can be further reduced are: (1) patterning of deep cavities, such as holes or trenches, within the semiconductor substrate; and (2) filling of the cavities with a converter or radiation-detecting material, such as boron. The widely used technologies are deep reactive ion etching for patterning, and CVD for boron filling. As noted above, alternative approaches are described herein which facilitate fabrication of solid-state radiation detectors at low cost.

In particular, the alternative cavity formation approach disclosed is to use selective electrochemical processing (SECE), in which "defect areas" or "defect points" are patterned on a main surface of the substrate in any desired pattern. This patterned substrate is then used as a working electrode in, for instance, an HF electrolyte. The structure is exposed to electromagnetic radiation from the back side of the substrate wafer to create "electron holes", which are drifted to defect points where the electric field is higher, and the wafer is then etched selectively to any desired depth. Advantageously, this SECE process is less complex than a deep reactive ion etching process that involves very advanced and expensive tools and toxic gasses. Also, the number of wafers that may be patterned is limited by the chamber size in a deep reactive ion etch approach, but with SECE, many wafers may be simultaneously processed. Further, the SECE process described herein works for any wafer of any orientation, such as with Si (100), (110), (111) wafers.

As a further advantage, electrophoretic deposition (EPD) is used for filling of the deep cavities formed by ECSE, or by other means. The radiation-detecting material may comprise Boron or a compound of Boron, using a range of nano-particles, micro-particle, or a combination of nano- and micro-scaled particles. In the electrophoretic deposition process, charged radiation-detecting particles are dispersed in a liquid (such as acetone, water, or isopropyl alcohol) in a container, and two electrodes are inserted into the solution. The patterned wafer is inserted between the electrode plates so that the particles are directed towards the trenches or holes by an applied electric field.

The concepts disclosed herein may be employed for selective etching of various semiconductor substrates (such as Si, Ge, GaAs, GaN, AlN, SiC) to pattern arrays of deep cavities, such as trenches or holes, using SECE processing, and filling of the cavities, for instance, with boron or a compound of boron (or CdTe, or CdZnTe), nano-scaled or micro-scaled particles using EPD processing for fabrication of a hetero-composite of radiation sensitive material and semiconductor for a neutron or gamma detection application. In the EPD process with HF as the electrolyte, for example, SiC, or Si is oxidized and dissolved in HF, and the etching proceeds until the cavities reach the desired depth. Note that the etching process is limited by the depletion width formation within the substrate. Further, the patterned substrate may be used as a working electrode, and the charged nano- and/or micro-particles in the liquid are inserted in between the electrodes, with the electric field lines normal to the electrodes, and with the particles being deposited within the cavities, since the other areas of the substrate are protected by the insulating material. In one or more implementations, the patterned substrate can be placed in between two parallel plate electrodes within the electrolyte solution so that the parallel electric fields direct the charged particles towards the cavities within which the material is to be deposited. Once the filling of the cavities is complete, the deposition process may continue to overfill the cavity, and hence, in certain applications, where higher density radiation-detecting material is desired within the cavities, a normal force can be uniformly applied to the overfilled radiation-detecting particles so that the particles further compress into the cavities, and thereby, are more densely deposited.

Advantageously, the fabrication approaches described herein are a green technology, which greatly reduce the cost of fabrication compared with existing technologies, and which are scalable to large sized wafers, or batches of wafers, without significant capital investment and processing equipment. Besides low cost and scalability, highly-ordered arrays of trenches or holes of any desired depth can be patterned in a semiconductor substrate of any crystalline orientation, and the patterned deep trenches or holes of very high aspect ratio can be filled with nano-scaled particles and/or micro-scaled particles completely to fabricate the hetero-composite of different materials. The fabricated hetero-composite substrate using SECE and EPD has numerous applications for a highly efficient neutron detector and gamma detector fabrication.

Further, in contrast to a CVD process, where the fill material exerts significant stress in the patterned substrates, and depending upon wall thickness, substrate breaks may occur, the EPD process does not exert stress on the substrate, as the deposition is carried out selectively at room temperature. Further, using the approaches described herein, no toxic gases or high-temperature processing is needed, which again lowers the manufacturing costs.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a radiation-detecting structure, the fabricating comprising:
providing a semiconductor substrate, the semiconductor substrate comprising a plurality of cavities extending into the semiconductor substrate from a surface thereof; and
electrophoretically depositing radiation-detecting particles of a radiation-detecting material into the plurality of cavities extending into the semiconductor substrate, wherein the electrophoretically depositing fills the plurality of cavities with the radiation-detecting particles.

2. The method of claim 1, wherein the providing comprises electrochemically etching the semiconductor substrate to form the plurality of cavities extending into the semiconductor substrate.

3. The method of claim 2, wherein the providing further comprises patterning the surface of the semiconductor substrate with a plurality of surface defect areas, and the electrochemically etching comprises using the plurality of surface defect areas to facilitate electrochemically etching into the semiconductor substrate through the plurality of surface defect areas to form the plurality of cavities extending into the semiconductor substrate.

4. The method of claim 2, further comprising connecting the semiconductor substrate to an electrode of an electrolytic apparatus, and using the electrolytic apparatus for both the electrochemically etching and the electrophoretically depositing.

5. The method of claim 2, wherein the electrochemically etching comprises forming the plurality of cavities with a width that is approximately constant for a length of the plurality of cavities beginning from the surface of the semiconductor substrate, wherein the approximately constant width of the plurality of cavities of the semiconductor substrate facilitates electrophoretically depositing the radiation-detecting material into the plurality of cavities.

6. The method of claim 2, wherein the surface of the semiconductor substrate comprises a (111) surface, and the electrochemically etching facilitates forming the plurality of cavities through the (111) surface of the semiconductor substrate.

7. The method of claim 2, wherein the electrochemically etching comprises using the semiconductor substrate as an electrode during the electrochemically etching.

8. The method of claim 1, wherein the electrophoretically depositing comprises:
dispersing the radiation-detecting particles within a liquid to which the plurality of cavities of the semiconductor substrate are exposed; and
applying an electromagnetic field, the electromagnetic field being substantially oriented along a direction in which the plurality of cavities extend into the semiconductor substrate, wherein the electromagnetic field facilitates depositing the radiation-detecting particles within the plurality of cavities of the semiconductor substrate.

9. The method of claim 8, wherein a strength of the electromagnetic field is selected to achieve a target packing ratio of the radiation-detecting particles within the plurality of cavities of the semiconductor substrate.

10. The method of claim 1, wherein the electrophoretically depositing comprises:
overfilling the plurality of cavities of the semiconductor substrate with the radiation-detecting particles; and
moving overfilled radiation-detecting particles above the plurality of cavities down into the plurality of cavities extending into the semiconductor substrate to further increase an amount of the radiation-detecting particles disposed therein.

11. The method of claim 10, wherein the moving comprises mechanically forcing the overfilled radiation-detecting particles into the plurality of cavities of the semiconductor substrate.

12. The method of claim 10, wherein the moving comprises annealing the radiation-detecting structure to diffuse the overfilled radiation-detecting particles into the plurality of cavities of the semiconductor substrate.

13. The method of claim 1, wherein the electrophoretically depositing comprises disposing different sized radiation-detecting particles of the radiation-detecting material in a range of 1 nm to 3 μm into the plurality of cavities of the semiconductor substrate, wherein the combination of the different sized radiation-detecting particles facilitates filling the plurality of the cavities of the semiconductor substrate with the radiation-detecting material.

14. The method of claim 1, wherein the providing comprises providing the plurality of cavities of the semiconductor substrate with a characteristic opening in a range of 3 μm to 5 μm, wherein the electrophoretically depositing facilitates driving the radiation-detecting particles in a range of 1 nm to 3 μm into the plurality of cavities.

15. The method of claim 1, wherein the electrophoretically depositing comprises using the semiconductor substrate as an electrode during the electrophoretically depositing.

16. The method of claim 1, further comprising forming, before the electrophoretically depositing, a continuous p-n junction within the semiconductor substrate and disposed, in part, parallel to the surface of the semiconductor substrate from which the plurality of cavities extend into the semiconductor substrate and in spaced opposing relation to inner cavity walls of the semiconductor substrate defining the plurality of cavities therein, wherein the continuous p-n junction is spaced from the surface of the semiconductor substrate a greater distance than the continuous p-n junction is spaced in opposing relation to the inner cavity walls of the semiconductor substrate.

17. The method of claim 1, wherein the radiation-detecting material responds to radiation by releasing charged reaction products, and the radiation-detecting structure senses the charged reaction products to detect the radiation.

18. The method of claim 1, wherein the radiation-detecting structure is a neutron-detecting structure, and the radiation-detecting material comprises boron.

19. The method of claim 1, wherein the radiation-detecting structure is a gamma radiation detecting structure, and the radiation-detecting material comprises a one of CdTe, or CdZnTe.

20. The method of claim 1, wherein the providing comprises forming the plurality of cavities with bottlenecks at openings thereof within the surface of the semiconductor substrate, and the electrophoretically depositing comprises using an electromagnetic field to drive the radiation-detecting particles through the bottlenecks at the openings of the plurality of cavities to fill the plurality of cavities with the radiation-detecting particles.

* * * * *